United States Patent
Wong et al.

(10) Patent No.: US 9,087,804 B2
(45) Date of Patent: Jul. 21, 2015

(54) HEAT DISSIPATING MODULE AND HEAT DISSIPATING METHOD THEREOF

(75) Inventors: Chun-Chieh Wong, Taipei (TW); Cheng-Yu Wang, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 374 days.

(21) Appl. No.: 13/463,828

(22) Filed: May 4, 2012

(65) Prior Publication Data

US 2012/0279688 A1    Nov. 8, 2012

(30) Foreign Application Priority Data

May 5, 2011    (CN) .......................... 2011 1 0115415

(51) Int. Cl.
*H01L 23/467* (2006.01)
*H01L 23/34* (2006.01)
*H01L 23/427* (2006.01)
*G06F 1/20* (2006.01)

(52) U.S. Cl.
CPC ...... *H01L 23/34* (2013.01); *G06F 1/20* (2013.01); *H01L 23/427* (2013.01); *H01L 23/467* (2013.01); *H01L 2924/0002* (2013.01)

(58) Field of Classification Search
CPC ...... H01L 23/427; H01L 23/467; G06F 1/203
USPC ............ 165/80.3, 122, 104.33, 299; 361/697, 361/700
See application file for complete search history.

(56) References Cited

U.S. PATENT DOCUMENTS

| 6,328,097 | B1 * | 12/2001 | Bookhardt et al. ...... | 165/104.33 |
|---|---|---|---|---|
| 6,621,698 | B2 * | 9/2003 | Chang ...................... | 361/679.47 |
| 7,212,404 | B2 * | 5/2007 | Wang et al ................ | 361/697 |
| 7,619,889 | B2 * | 11/2009 | Yu et al. ................... | 361/699 |
| 7,675,752 | B2 * | 3/2010 | Hongo ...................... | 361/700 |
| 2002/0181200 | A1 * | 12/2002 | Chang ...................... | 361/687 |
| 2005/0006085 | A1 * | 1/2005 | Nelson ..................... | 165/299 |
| 2006/0139880 | A1 * | 6/2006 | Tate .......................... | 361/697 |
| 2006/0256520 | A1 * | 11/2006 | Chen ......................... | 361/687 |
| 2007/0131383 | A1 * | 6/2007 | Hattori et al. ............ | 165/11.2 |
| 2008/0123298 | A1 * | 5/2008 | Takeguchi et al. ...... | 361/702 |
| 2009/0009967 | A1 * | 1/2009 | Nishizawa et al. ...... | 361/695 |
| 2009/0046428 | A1 * | 2/2009 | Hung et al. .............. | 361/697 |
| 2009/0078396 | A1 * | 3/2009 | Bhatti et al. ............. | 165/104.33 |
| 2009/0129020 | A1 * | 5/2009 | Fujiwara .................. | 361/697 |

(Continued)

FOREIGN PATENT DOCUMENTS

| CN | 1245871 | 3/2000 |
|---|---|---|
| CN | 101355863 | 1/2009 |
| CN | 101370371 | 2/2009 |

*Primary Examiner* — Allen Flanigan
(74) *Attorney, Agent, or Firm* — Jianq Chyun IP Office

(57) ABSTRACT

A heat dissipating module disposed between a plurality of heating elements is provided. The heat dissipating module includes a plurality of heat conducting units, a set of heat dissipating fins, a plurality of fans, a plurality of sensing units and a control unit. The heat conducting units are connected to the set of the heat dissipating fins and the heating elements. A gap exists between the heat conducting units. The fans are disposed at the same side of the set of the heat dissipating fins. The sensing units are coupled to the heating elements, respectively, to detect the heat generated by the heating elements. The control unit is electrically connected to the fans and the sensing units. The heat generated by the heating elements is different from each other, and the control unit adjusts the speed of the fans according to the heat generated by the heating elements.

5 Claims, 8 Drawing Sheets

(56) References Cited

U.S. PATENT DOCUMENTS

2009/0323277 A1* 12/2009 Hosokawa ............... 361/679.54
2010/0246127 A1* 9/2010 Liu et al. ..................... 361/697
2010/0328878 A1* 12/2010 Fujiwara .................. 361/679.47
2011/0032675 A1* 2/2011 Lian et al. ..................... 361/697
2011/0267777 A1* 11/2011 Oike et al. ..................... 361/697

* cited by examiner

HEAT DISSIPATING MODULE AND HEAT DISSIPATING METHOD THEREOF

CROSS-REFERENCE TO RELATED APPLICATION

This application claims the priority benefit of China application serial no. 201110115415.X, filed on May 5, 2011. The entirety of the above-mentioned patent application is hereby incorporated by reference herein and made a part of specification.

BACKGROUND OF THE INVENTION

1. Field of the Invention

The invention relates to a heat dissipating module and a heat dissipating method and, more particularly, to a heat dissipating module of an electronic device and a heat dissipating method thereof.

2. Description of the Related Art

As computer technology develops rapidly, efficiency of the computer is improved, and thus heat generation rate of electronic components in the computer host increases. In order to prevent the electronic components from overheating and further to lead to temporary or permanent failure, sufficient heat dissipating efficiency is needed.

For example, in a computer system, a center process unit (CPU), a north bridge chip, a south bridge chip and other heating elements are disposed at a motherboard. In conventional technology, a heat dissipating device is usually disposed at the heating elements to dissipate heat of the motherboard.

Taking a notebook computer as an example, a gaming notebook computer usually uses a CPU and a video graphics array (VGA) with a high specification, and two heat dissipating modules are disposed at the CPU and the VGA correspondingly for heat dissipation. However, the two heat dissipating modules occupy much space in the host, and if the CPU and the VGA are operating with a high load, the speed of fans increases, which makes noise and shortens working life of the fans.

BRIEF SUMMARY OF THE INVENTION

A heat dissipating module and a heat dissipating method thereof with a better heat dissipating efficiency are disclosed.

The heat dissipating module is disposed between a plurality of heating elements. The heat dissipating module includes a plurality of heat conducting units, a set of heat dissipating fins, a plurality of fans, a plurality of sensing units and a control unit. The heat conducting units are connected to the set of the heat dissipating fins and the heating elements, and a gap exists between the heat conducting units. The fans are disposed at the same side of the set of the heat dissipating fins. The sensing units are coupled to the heating elements to detect heat generated by the heating elements. The control unit is electrically connected to the fans and the sensing units. The heat generated by the heating elements is different from each other and the control unit adjusts the speed of the fans according to the heat generated by the heating elements.

The heat dissipating method includes following steps: disposing a plurality of fans to the heating elements, detecting heat generated by the heating elements, and adjusting speed of the fans corresponding to the heating elements. The heating elements generate first heat and second heat which are different. When the first heat is more than the second heat, the first heat is dissipated via the set of the heat dissipating fins, the heating element generating the second heat and the heat conducting units. When the second heat is more than the first heat, the second heat is dissipated via the set of the heat dissipating fins, the heating element generating the first heat and the heat conducting units.

These and other features, aspects and advantages of the present invention will become better understood with regard to the following description, appended claims, and accompanying drawings.

DETAILED DESCRIPTION OF THE EMBODIMENTS

Figure 1:
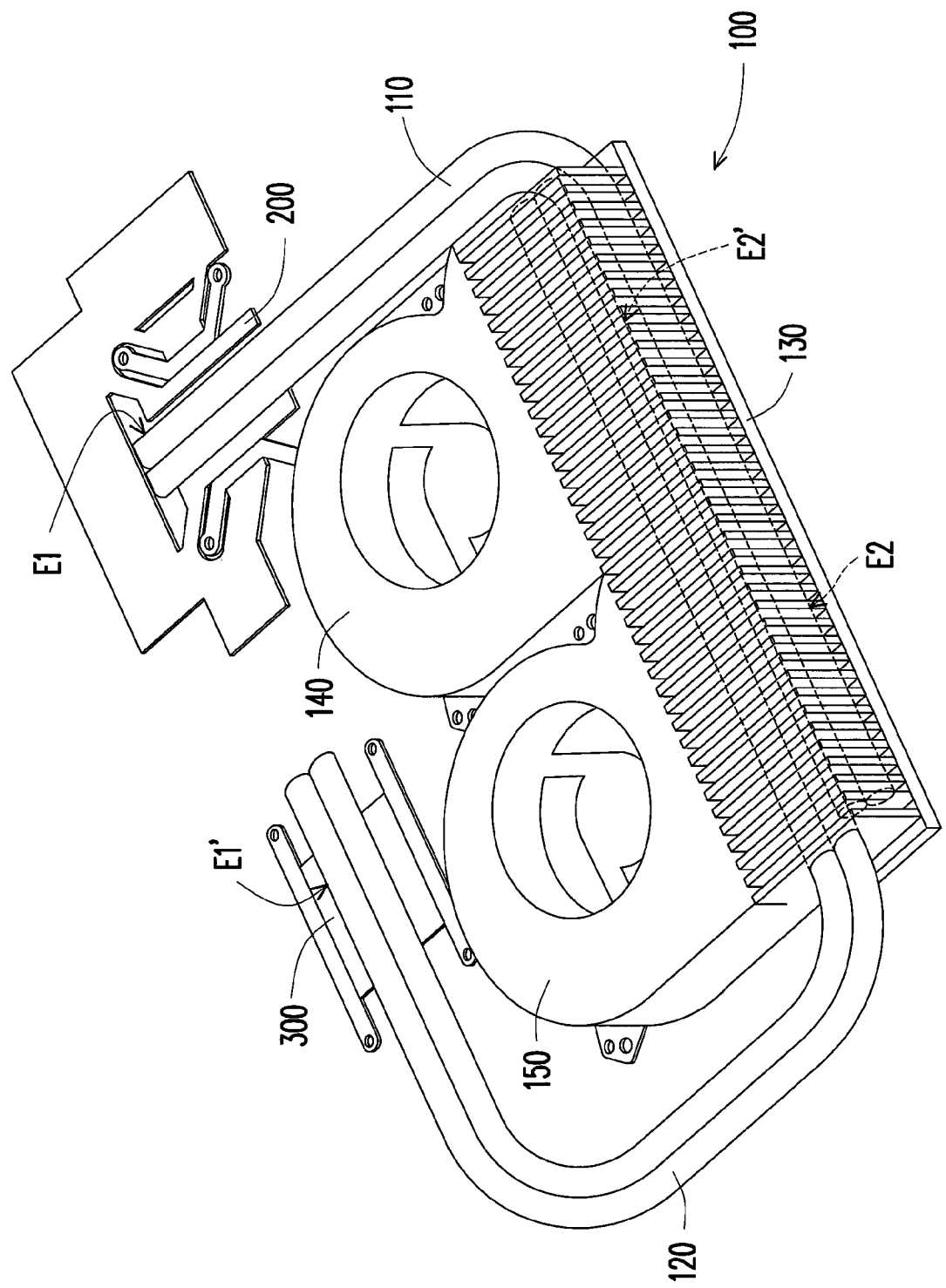
FIG. 1 is a schematic diagram showing a heat dissipating module in a first embodiment.
Figure 2:
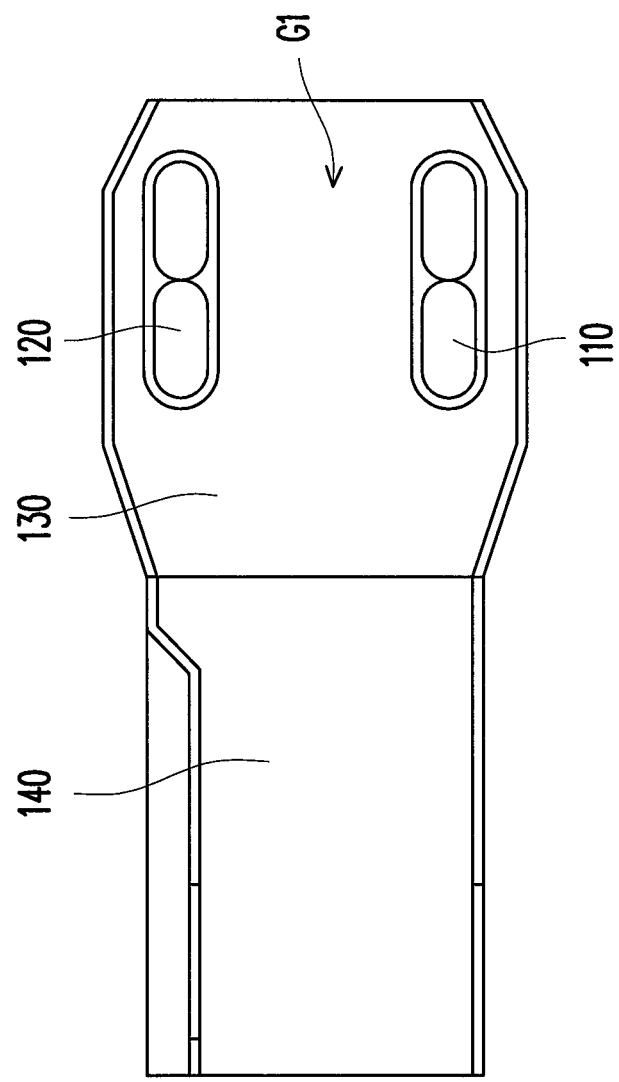
FIG. 2 is a sectional schematic diagram showing a heat dissipating module in a set of heat dissipating fins in a first embodiment.

FIG. 1 is a schematic diagram showing a heat dissipating module in a first embodiment. FIG. 2 is a sectional schematic diagram showing a heat dissipating module in a set of heat dissipating fins in a first embodiment. The heat dissipating module 100 is disposed between two heating elements 200 and 300 to dissipate heat. The heat dissipating module 100 includes two heat conducting units 110 and 120, a set of heat dissipating fins 130, two fans 140 and 150. The heat conducting units 110 and 120 can be heat pipes. The heat conducting units 110 includes a first end E1 and a second end E2. The heat conducting units 120 includes a first end E1' and a second end E2'. The first ends E1 and E1' of the heat conducting units 110 and 120 are respectively connected to the heating elements 200 and 300, respectively. The second ends E2 and E2' of the heat conducting units 110 and 120 are connected to the set of the heat dissipating fins 130 oppositely. The fans 140 and 150 are disposed at the same side of the set of the heat dissipating fins 130 and corresponding to the heating elements 200 and 300. The relative positions of the heat conducting units, the heating elements, the set of the heat dissipating fins and the fans can be adjusted according to requirements.

In FIG. 2, the heat conducting units 110 and 120 connected to the set of the heat dissipating fins 130 are overlapped, and a gap G1 exists between the heat conducting units 110 and 120 to let air from the fans 140 and 150 flow through. In other words, the heat generated by the heating elements 200 and 300 is transferred to the set of the heat dissipating fins 130 via the heat conducting units 110 and 120, and the heat is taken away from the set of the heat dissipating fins 130 with the air generated by the fans 140 and 150, so as to dissipate heat of the heating elements 200 and 300.

Figure 3:
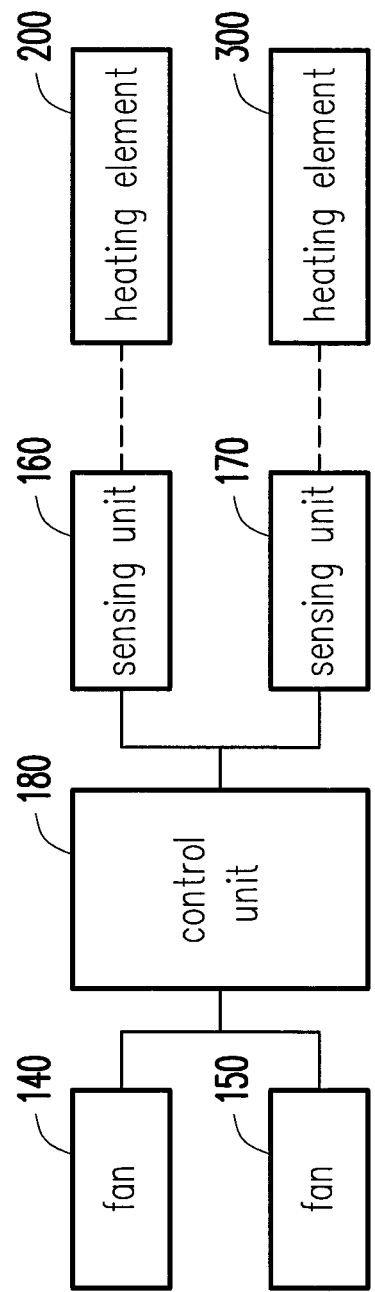
FIG. 3 is a block diagram showing the heat dissipating module in FIG. 1.

FIG. 3 is a block diagram showing the heat dissipating module in FIG. 1. The heat dissipating module 100 further includes two sensing units 160 and 170 and a control unit 180.

The sensing units 160 and 170 are coupled to the heating elements 200 and 300 correspondingly to detect the heat generated by the heating elements 200 and 300. The control unit 180 is electrically connected to the fans 140 and 150 and the sensing units 160 and 170. The control unit 180 also adjusts the speed of the fans 140 and 150 according to the heat of the heating elements 200 and 300 sensed by the sensing units 160 and 170. For example, when first heat of the heating element 200 is more than second heat of the heating element 300, the control unit 180 receives a sensing signal from the sensing units 160 and 170 and drives the fan 140 to rotate in a higher speed than the fan 150, so as to improve the heat dissipating efficiency of the heating element 200 correspondingly.

In FIG. 1, the heat conducting units 110 and 120 are connected to the set of the heat dissipating fins 130 oppositely and are disposed at different positions of the set of the heat dissipating fins 130. The parts of the heat conducting units 110 and 120 in the set of the heat dissipating fins 130 cross the air flow generated by the fans 140 and 150, and dissipate the heat transferred to the set of the heat dissipating fins 130.

Moreover, the first heat generated by the heating element 200 and the second heat generated by the heating element 300 are different due to the features of the heating elements. Since the directions of the heat transferring from the heating elements 200 and 300 to the set of the heat dissipating fins 130 are different, when the first heat is more than the second heat and the first heat is not dissipated completely from the set of the heat dissipating fins 130 via the fans 140, it can also be dissipated via a connecting part of the set of the heat dissipating fins 130 and the heat conducting unit 120, and further be transferred to the heat conducting unit 120 and the heating element 300 for heat dissipation. For example, when the heat transferred from the first end E1 of the heat conducting unit 110 to the second end E2 is not dissipated completely via the set of the heat dissipating fins 130, it can be transferred to the second end E2' and the first end E1' of the heat conducting unit 120 and the heating element 300 via the set of the heat dissipating fins 130 for a further heat dissipation. Contrarily, when the second heat is more than the first heat, the further heat dissipation is executed reversely.

In other words, the heat dissipating module 100 can provide corresponding heat dissipating effects to different heating elements 200 and 300, and thus the heat generated by the heating element 200 can be dissipated via the heating element 300, the heat conducting unit 120 and the set of the heat dissipating fins 130, which doubles the heat dissipating effect of the heat dissipating module 100. Consequently, the components (the set of the heat dissipating fins 130, the heat conducting unit 120 and the heating element 300) are used as extending heat dissipating components to enlarge the heat dissipating area of the heat dissipating module 100, and the speed of the fan 140 corresponding to the heating elements 200 does not need to be increased to a limitation, which avoids shortening the working life of the fans 140 due to a heavy load and improves reliability of the heat dissipating module 100 relatively.

Figure 4:
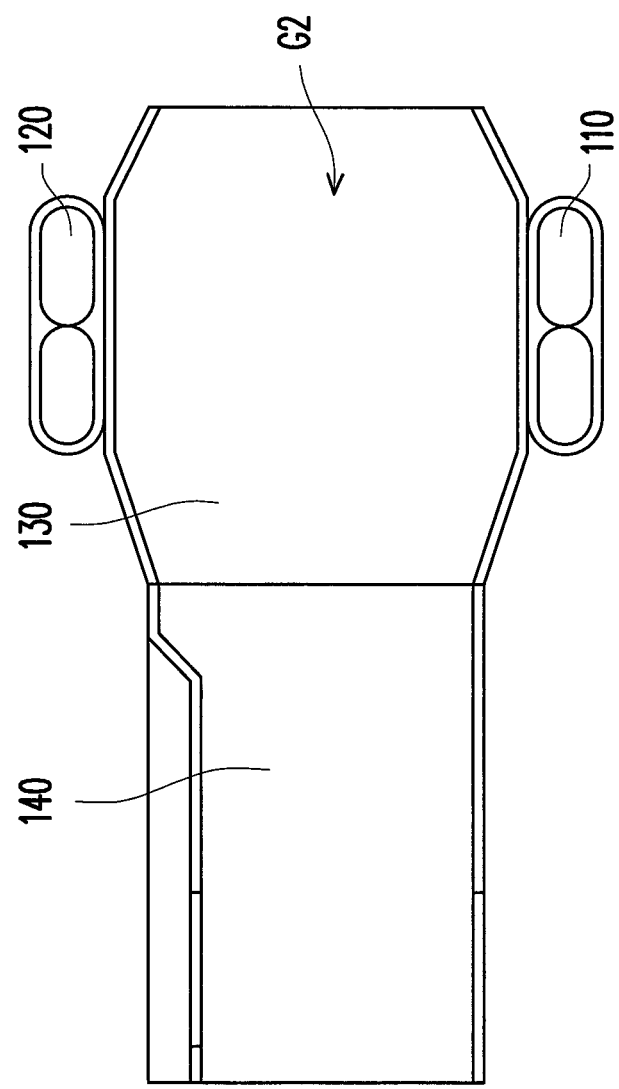
FIG. 4 is a sectional schematic diagram showing a heat dissipating module in a second embodiment.

The heat conducting units 110 and 120 pass through the set of the heat dissipating fins 130 in opposite directions, and the parts in the set of the heat dissipating fins 130 are overlapped to form the gap G1, so as to let the air generated by the fans 140 and 150 flow through the gap G1 between the heat conducting units 110 and 120, which is not limited herein. FIG. 4 is a sectional schematic diagram showing a heat dissipating module in a second embodiment. The heat conducting units 110 and 120 are connected to edges of the set of the heat dissipating fins 130, and thus a gap G2 between the heat conducting units 110 and 120 corresponding to the heating elements 200 and 300 is the widest.

Figure 5:
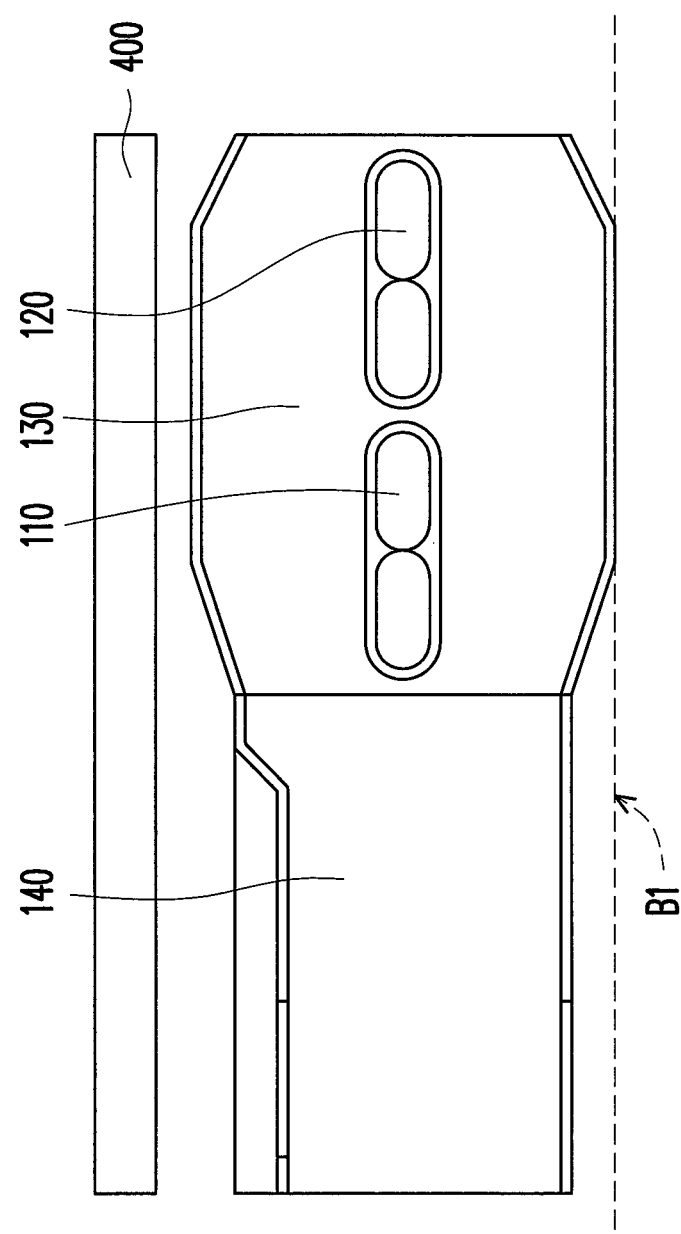
FIG. 5 is a sectional schematic diagram showing a heat dissipating module in a third embodiment.

FIG. 5 is a sectional schematic diagram showing a heat dissipating module in a third embodiment. Projections of the parts of the heat conducting units 110 and 120 in the set of the heat dissipating fins 130 at a bottom B1 of the set of the heat dissipating fins 130 do not overlapped, and the heights between the heat conducting units 110 and 120 and the bottom B1 of the set of the heat dissipating fins 130 are the same. In other words, after the heat dissipating module 100 is assembled, the heat conducting units 110 and 120 are at one same plane, which means the heat conducting units 110 and 120 are disposed in the set of the heat dissipating fins 130 side by side. Thus, the set of the heat dissipating fins 130 includes the largest heat dissipating area and the heat dissipating efficiency is improved. Moreover, when the heat dissipating module 100 is disposed in a casing 400 of an electronic device (not shown), since a distance between the heat conducting units 110 and 120 and the casing 400 is large, the heat is not transferred to the surface of the casing 400 and the user does not feel uncomfortable.

Figure 6:
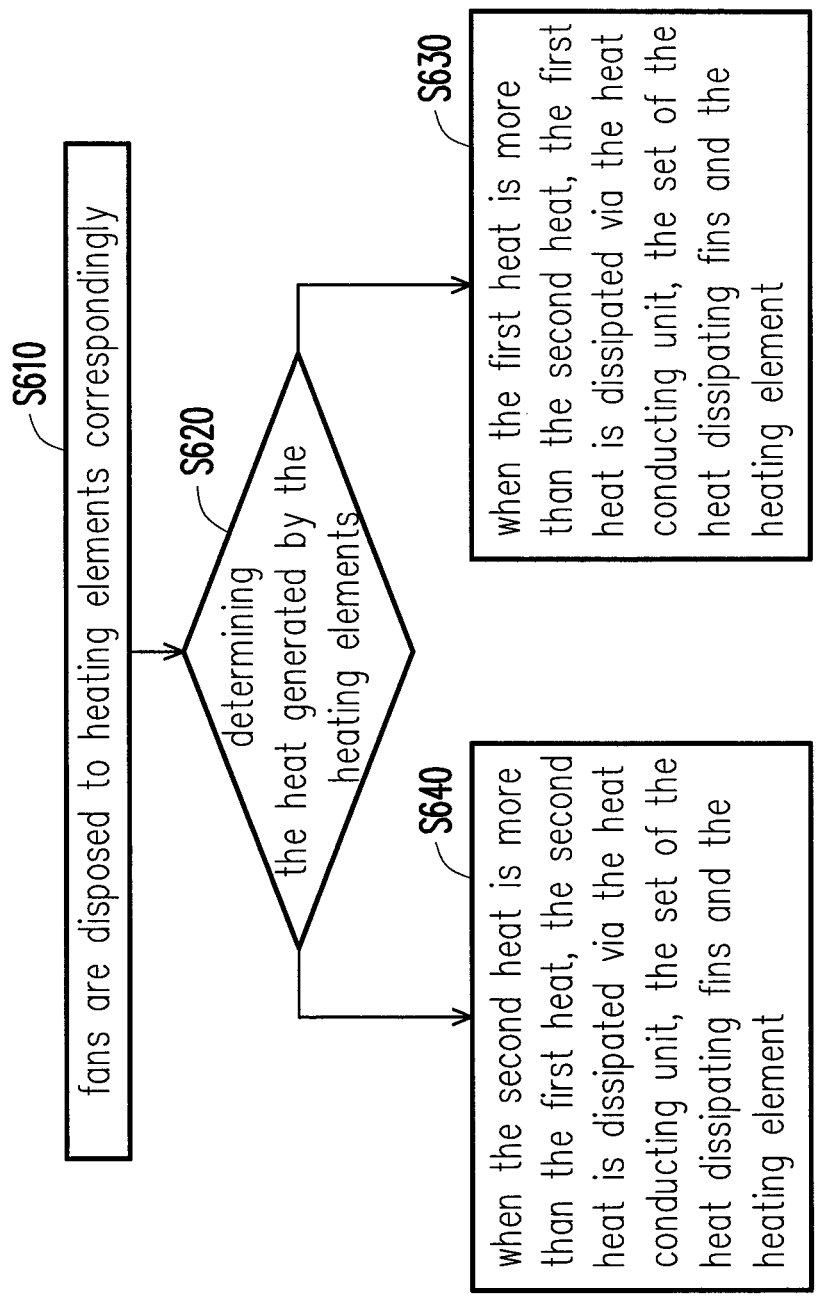
FIG. 6 is a flow chart showing steps of a heat dissipating method applied to a heat dissipating module in a first embodiment.
Figure 7:
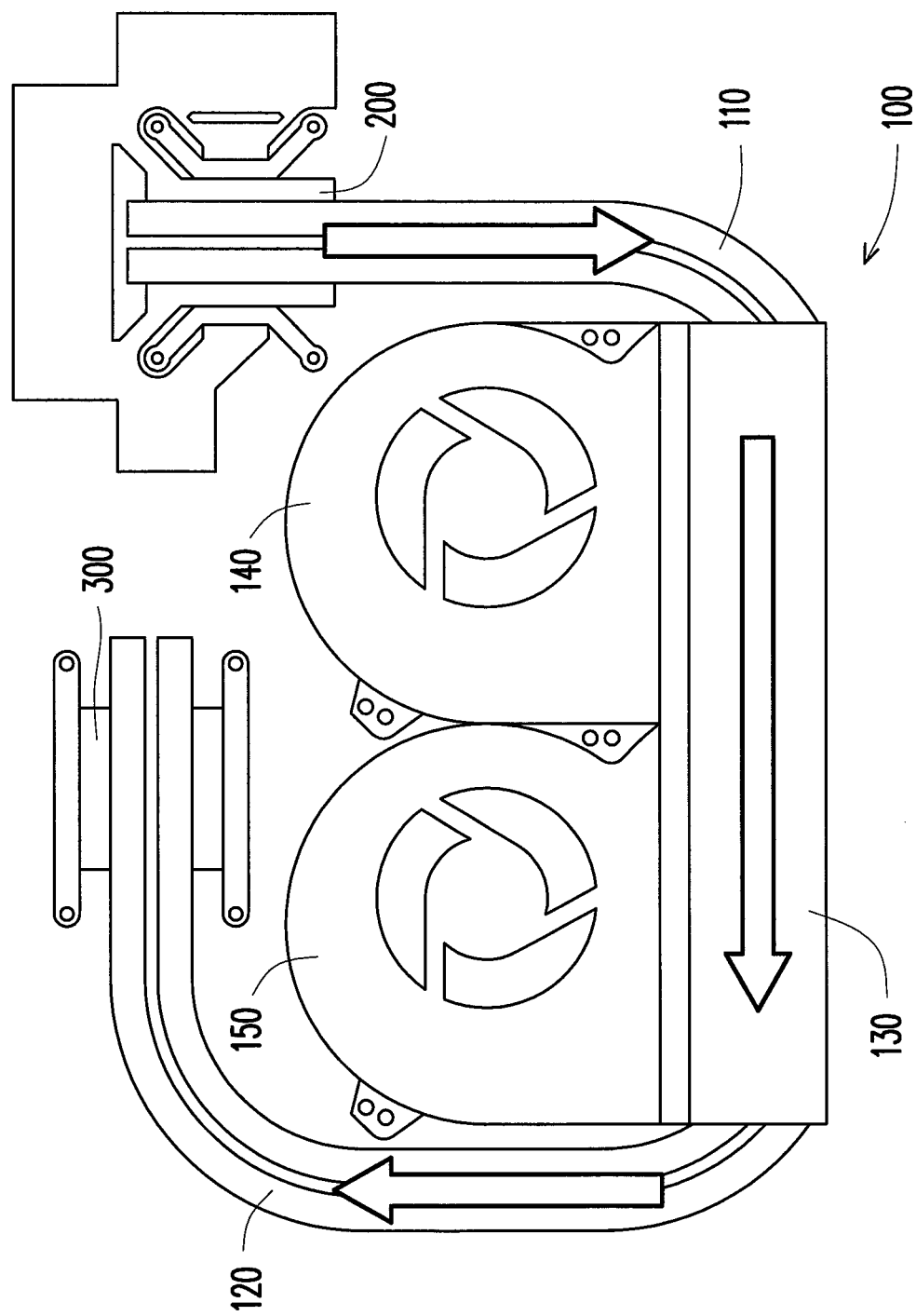
FIG. 7 and FIG. 8 are schematic diagrams showing heat distribution of a heat dissipating module under different states.
Figure 8:
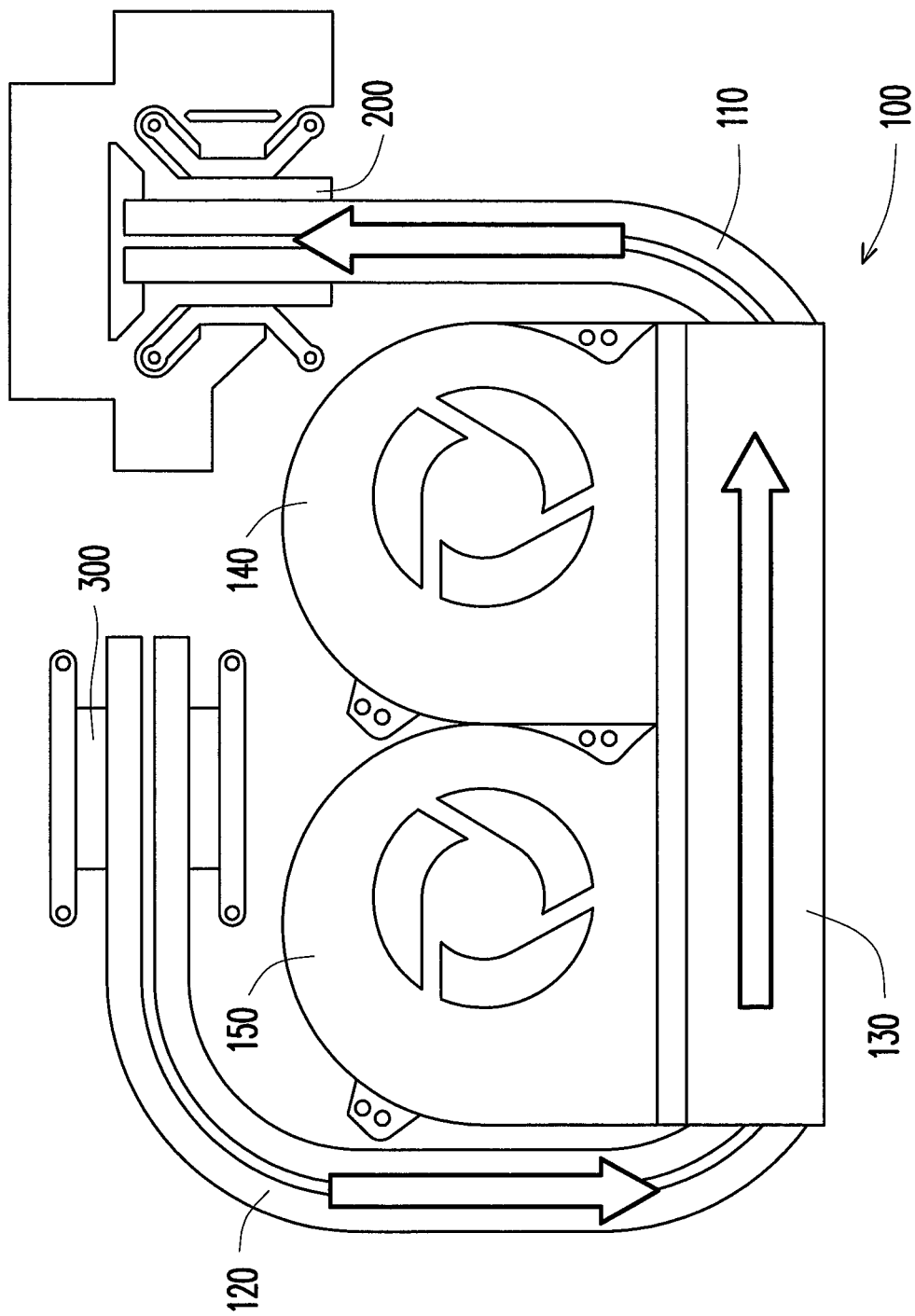

FIG. 6 is a flow chart showing steps of a heat dissipating method applied to the heat dissipating module in FIG. 1. FIG. 7 and FIG. 8 are schematic diagrams showing heat distribution of the heat dissipating module under different states, and arrows represent the direction of the heat transferring.

In step S610, the fans 140 and 150 are disposed to the heating elements 200 and 300 correspondingly. In other words, the fans 140 and 150 are disposed corresponding to the heating elements 200 and 300 via the control unit 180 (shown in FIG. 3), and the speed of the fans 140 and 150 increases as the heat generated by the heating elements 200 and 300 increases.

In step S620, the heat generated by the heating elements 200 and 300 is determined, the heating element 200 generates the first heat, and the heating element 300 generates the second heat. When the first heat is more than the second heat, step S630 is executed.

In FIG. 7, the first heat is dissipated via the heat conducting unit 120, the set of the heat dissipating fins 130 and the heating element 300. When the second heat is more than the first heat, step S640 is executed. In FIG. 8, the second heat is dissipated via the heat conducting units 110, the set of the heat dissipating fins 130 and the heating elements 200. Thus, heating element 200 or 300 which generates more heat can use the heat conducting units 110 and 120, the set of the heat dissipating fins 130 and the heating element 200 or 300 which generates less heat to dissipate heat, so as to improve the heat dissipating efficiency of the heat dissipating module 100.

In sum, in the heat dissipating module, the heat conducting units connected to two different heating elements are connected to the set of the heat dissipating fins oppositely, and thus, the heating element generating more heat can use the set of the heat dissipating fins, the heating element generating less heat and the heat conducting units connected thereto to dissipate heat. Consequently, the heat dissipating area of the heat dissipating module is enlarged and the heat dissipating efficiency is improved.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. A heat dissipating module disposed between a plurality of heating elements, the heat dissipating module comprising:
   a plurality of heat conducting units connected to the heating elements, respectively;
   a set of heat dissipating fins connected to the heat conducting units, wherein a gap exists between the heat conducting units;
   a plurality of fans disposed at the same side of the set of the heat dissipating fins;
   a plurality of sensing units coupled to the heating elements, respectively, to detect heat generated by the heating elements; and
   a control unit electrically connected to the fans and the sensing units, wherein the heat generated by the heating elements is different from each other and the control unit adjusts the speed of the fans according to the heat generated by the heating elements, when one of the heating elements generates more heat than other heating elements, the control unit drives the fan corresponding to the heating element generating more heat than other heating elements to rotate in a higher speed than other fans.

2. The heat dissipating module according to claim 1, wherein the heat conducting units are connected to edge of the set of the heat dissipating fins, respectively.

3. The heat dissipating module according to claim 1, wherein the heat conducting units pass through the set of the heat dissipating fins.

4. The heat dissipating module according to claim 3, wherein projections of the heat conducting units passing through the set of the heat dissipating fins at a bottom of the set of the heat dissipating fins are not overlapped.

5. The heat dissipating module according to claim 1, wherein if the heating element generates more heat, the heat is transferred to the heating element generating less heat via the heat conducting units and the set of the heat dissipating fins.

* * * * *